(12) United States Patent
Zhu et al.

(10) Patent No.: US 8,466,500 B2
(45) Date of Patent: Jun. 18, 2013

(54) SEMICONDUCTOR DEVICE AND METHOD FOR MANUFACTURING THE SAME

(75) Inventors: Huilong Zhu, Poughkeepsie, NY (US); Qingqing Liang, Beijing (CN); Haizhou Yin, Poughkeepsie, NY (US); Zhijiong Luo, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 163 days.

(21) Appl. No.: 13/063,977

(22) PCT Filed: Feb. 24, 2011

(86) PCT No.: PCT/CN2011/071230
§ 371 (c)(1),
(2), (4) Date: Mar. 15, 2011

(87) PCT Pub. No.: WO2011/134301
PCT Pub. Date: Nov. 3, 2011

(65) Prior Publication Data
US 2011/0260214 A1 Oct. 27, 2011

(51) Int. Cl.
*H01L 33/12* (2010.01)
(52) U.S. Cl.
USPC ............ 257/255; 257/347; 257/E27.06
(58) Field of Classification Search
USPC ............ 257/255, 347, 351, E27.06, E27.112, 257/E21.545–E21.546, E21.564, E21.632, 257/350, 353, 354, E21.561, E21.618, E21.628, 257/E21.633, E21.642; 438/154, 164, 199, 438/221
See application file for complete search history.

(56) References Cited

U.S. PATENT DOCUMENTS

| | | | |
|---|---|---|---|
| 7,888,197 B2 * | 2/2011 | Chidambarrao et al. | 438/221 |
| 2007/0257249 A1 * | 11/2007 | Mocuta et al. | 257/19 |
| 2008/0054301 A1 | 3/2008 | Wang et al. | |
| 2008/0169508 A1 | 7/2008 | Chidambarrao et al. | |
| 2008/0237709 A1 * | 10/2008 | Chidambarrao et al. | 257/347 |

FOREIGN PATENT DOCUMENTS

| | | |
|---|---|---|
| CN | 101023530 A | 8/2007 |
| CN | 101136434 A | 3/2008 |
| CN | 101221901 A | 7/2008 |
| CN | 101292334 A | 10/2008 |
| CN | 101378080 A | 3/2009 |
| WO | PCT/CN2011/071093 | 2/2011 |

* cited by examiner

Primary Examiner — Cuong Q Nguyen
Assistant Examiner — Yosef Gebreyesus
(74) Attorney, Agent, or Firm — Troutman Sanders LLP

(57) ABSTRACT

The present invention discloses a semiconductor device and a method for manufacturing the same, and relates to the field of semiconductor manufacturing. According to the present invention, the semiconductor device comprises: a semiconductor substrate; a gate region located above the semiconductor substrate; S/D regions located at both sides of the gate region and made of a stress material; wherein a concentrated stress region is formed between the gate region and the semiconductor substrate, and the concentrated stress region comprises an upper SOI layer adjacent to the gate region above, and a lower stress release layer adjacent to the semiconductor substrate below. The present invention applies to the manufacturing of a MOSFET.

12 Claims, 4 Drawing Sheets

SEMICONDUCTOR DEVICE AND METHOD FOR MANUFACTURING THE SAME

BENEFIT CLAIMS

This application is a US National Stage of International Application No. PCT/CN2011/071230, filed Feb. 24, 2011, which claims the benefit of CN 201010159892.1, filed Apr. 27, 2010.

FIELD OF THE INVENTION

The present invention relates to a technical field of semiconductors, and particularly, to a semiconductor device capable of enhancing channel stress and a method for manufacturing the same.

BACKGROUND OF THE INVENTION

With the constant development of semiconductor technique, the integration level of integrated circuits is becoming higher, and the device size is reduced continuously. However, the performance of the device is also greatly influenced due to the continuous reduction of the device size.

An important factor for keeping appropriate performance in a field effect transistor is the carrier mobility, which influences the current or the amount of electric charges capable of flowing in the channel of a semiconductor device. After the technique of complementary metal oxide semiconductor transistors (CMOST) of 90 nm node has been developed, the stress technique may be applied to increase the carrier mobility, so as to increase the driving current of the device. For example, with respect to a metal oxide semiconductor field effect transistor (MOSFET), it is possible to increase the carrier mobility by applying stresses onto the channel between the source/drain regions, so as to improve the performance of an integrated circuit. Particularly, for an nMOSFET, the carriers in the channel are electrons, and the tensile stresses at both sides of the channel may increase the electron mobility; while for a pMOSFET, the carriers in the channel are holes, and the compressive stresses at both sides of the channel may increase the hole mobility.

With the further improvement of the integration level of integrated circuits, the requirements for stress applications during the manufacturing of semiconductor devices are also increased in the industry.

SUMMARY OF THE INVENTION

In order to further improve the stress in the channel of the semiconductor device, a semiconductor device is provided according to an aspect of the invention, including: a semiconductor substrate; a gate region located above the semiconductor substrate; source/drain (S/D) regions located at both sides of the gate region and made of a stress material; wherein a concentrated stress region is formed between the gate region and the semiconductor substrate, and the concentrated stress region comprises an upper silicon on insulator (SOI) layer adjacent to the gate region above, and a lower stress release layer adjacent to the semiconductor substrate below.

Preferably, an oxide layer is further provided between the SOI layer and the stress release layer; and an oxide layer is further provided between the stress release layer and the semiconductor substrate. Preferably, the glass transition temperature of the stress release layer is lower than 1100° C.

In case the semiconductor device is an nMOSFET, the material forming the source/drain regions is a tensile stress material such as Si:C, and preferably the content of C is 0.2%~2%. In case the semiconductor device is a pMOSFET, the material forming the source/drain regions is a compressive stress material such as SiGe, and preferably the content of Ge is 15%~60%.

Preferably, the lateral width of the stress release layer is smaller than that of the SOI layer, so as to form undercuts at both sides of the stress release layer, and the stress release layer is softened by annealing at 900~1100° C. Preferably, both sides of the stress release layer are provided with sidewall spacers formed of monocrystal or polycrystal SiGe, wherein the content of Ge in SiGe is 5%~20%. The source/drain regions may be obtained by an epitaxial growth of SiGe forming the sidewall spacers.

According to another aspect of the present invention, a method for manufacturing semiconductor device is provided, including: providing a semiconductor substrate; forming a concentrated stress region and a gate region on the semiconductor substrate, wherein the concentrated stress region comprises an upper SOI layer adjacent to the gate region above, and a lower stress release layer having a glass transition temperature lower than 1100° C. and adjacent to the semiconductor substrate below; and forming S/D regions at both sides of the gate region by using a stress material.

Preferably, the step for forming the concentrated stress region and the gate region includes: depositing the stress release layer on the semiconductor substrate; forming the SOI layer on the stress release layer; forming, on the SOI layer, the gate region and first sidewall spacers at both sides of the gate region; and etching downwards from the first sidewall spacers to form the concentrated stress region including the SOI layer and the stress release layer. In order to further optimize the device performance, the stress release layer may be further etched sidewise so as to form undercuts between the stress release layer and its upper and lower adjacent layers.

Preferably, an oxide layer may be deposited on the semiconductor substrate before and/or after depositing the stress release layer on the semiconductor substrate, so as to obstruct the atoms in the stress release layer from being diffused into the semiconductor substrate and the SOI region.

In addition, after the concentrated stress region is formed, second sidewall spacers are preferably formed at both sides of the stress release layer. The specific steps for forming the second sidewall spacers include: depositing an amorphous SiGe layer; forming a monocrystal or polycrystal SiGe layer by annealing the amorphous SiGe layer; and etching the monocrystal or polycrystal SiGe layer to form the second sidewall spacers at both sides of the stress release layer.

Epitaxial growth of S/D regions may be carried out at both sides of the gate region by taking SiGe of the second sidewall spacers as the source. In case an nMOSFET is to be manufactured, an epitaxial growth of tensile stress materials such as Si:C is carried out; and in case a pMOSFET is to be manufactured, an epitaxial growth of compressive stress materials such as SiGe is carried out, so as to form the S/D regions. After the S/D regions are formed, the semiconductor device is preferably annealed at 900~1100° C. to soften the stress release layer, so that the stress material of the S/D regions may apply a tensile stress or a compressive stress to the channel of the SOI region.

Preferably, the stress release layer has a glass transition temperature lower than 1100° C., and may be formed of borophosphosilicate glass (BPSG) and/or phosphosilicate glass (PSG).

According to the embodiments of the present invention, since the stress release layer is softened at a high temperature, the stress material of the S/D regions may apply a tensile stress or a compressive stress to the SOI channel region, so as to increase the carrier mobility in the channel and improve the device performance.

BRIEF DESCRIPTION OF THE DRAWINGS

The aforementioned and other objects, features and advantages of the present invention will be clearer by the following descriptions of the embodiments of the present invention with reference to the drawings, in which.

DETAILED DESCRIPTION OF THE EMBODIMENTS

The following disclosure provides several different embodiments or examples to implement the technical solution of the present invention. Although components and settings of specific examples are described in the following, they are just exemplary and do not intend to limit the present invention.

In addition, the reference numbers and/or letters may be repeated in different embodiments of the present invention. Such a repeat is made for the purposes of simplification and clearness, and it does not indicate the relationships between the discussed embodiments and/or settings.

The present invention provides various examples of specific processes and/or materials, but it is obvious that substitutive applications of other processes and/or materials realizable by a person skilled in the art do not deviate from the protection scope of the present invention. To be emphasized, the boundaries of the various regions as described herein include necessary extensions made upon the demand of process or procedure.

FIGS. 1~9 illustrate in detail the cross-section view of the device structure in each step of the flow for manufacturing the semiconductor device according to the embodiments of the present invention. Hereinafter the steps according to the embodiments of the present invention and the semiconductor device obtained thereby will be described in detail with reference to these drawings. A MOSFET is manufactured in the embodiments of the present invention.

Figure 1:
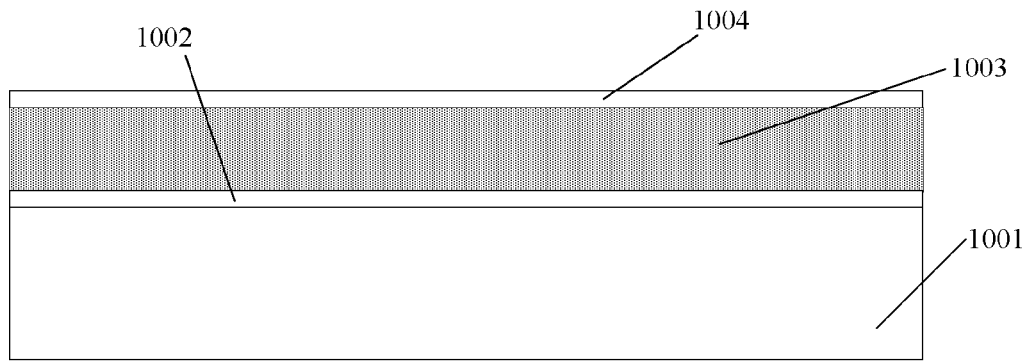
FIGS. 1~9 illustrate the structural cross-section view of the device in each step of a flow for manufacturing a semiconductor device according to the embodiments of the present invention.

Firstly, as illustrated in FIG. 1, a semiconductor substrate 1001 such as a Si substrate is provided. An oxide layer 1002 such as SiO$_2$ is deposited on the substrate 1001 with a thickness of 5~20 nm. A layer of BPSG 1003 is formed on the oxide layer 1002 with a thickness of about 50~100 nm. This layer of BPSG may be formed at a temperature of 800~1100° C., and may be a material having a glass transition temperature lower than 1100° C., or may be for example PSG, etc. An oxide layer 1004 such as SiO$_2$ with a thickness of 10~20 nm is deposited on the BPSG 1003. The oxide layers 1002 and 1004 are used as diffusion barrier layers of the BPSG to prevent B or P therein from being diffused into the substrate or SOI. The diffusion barrier layers may be made of other insulation materials.

Figure 2:
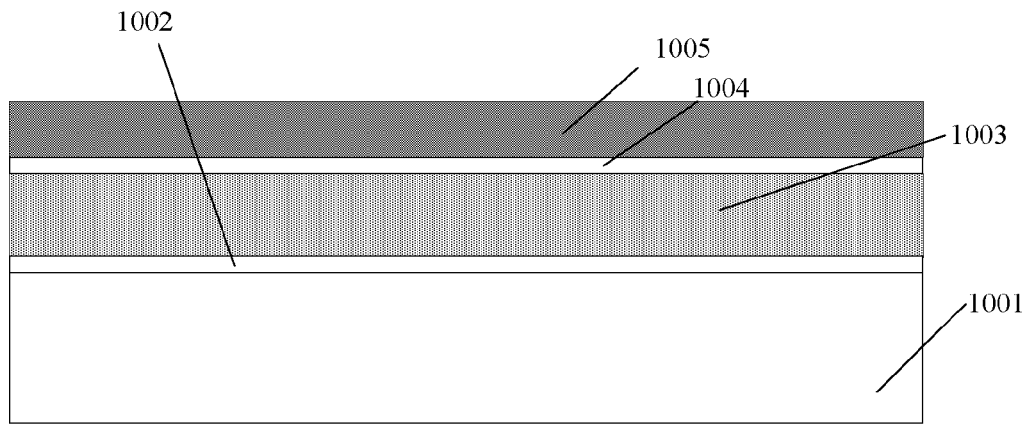

Next, as illustrated in FIG. 2, a layer of silicon on insulator (SOI) 1005 may be formed on the structure as illustrated in FIG. 1 by using a method of SmartCut™ known by a person skilled in the art. The method of SmartCut™ is detailed as follows: implanting hydrogen ions of a certain dose into another silicon wafer; bonding a surface of the silicon wafer where the hydrogen ions are implanted with an upper surface of the silicon wafer as illustrated in FIG. 1 by a bonding technique; in the subsequent thermal treatment process, forming a micro-cavity layer at the projection range of the silicon wafer where the hydrogen ions are implanted, and forming an SOI layer on the surface of the silicon wafer; further, stripping off the SOI layer from the surface at the range, so that the SOI layer is transferred onto the surface of the silicon wafer as illustrated in FIG. 1, and thus the silicon wafer as illustrated in FIG. 2 is obtained. The thickness of the SOI layer may be controlled by the hydrogen implantation energy. This step is irrelevant to the present invention, and the detailed steps may be acquired by referring to the prior art.

Figure 3:
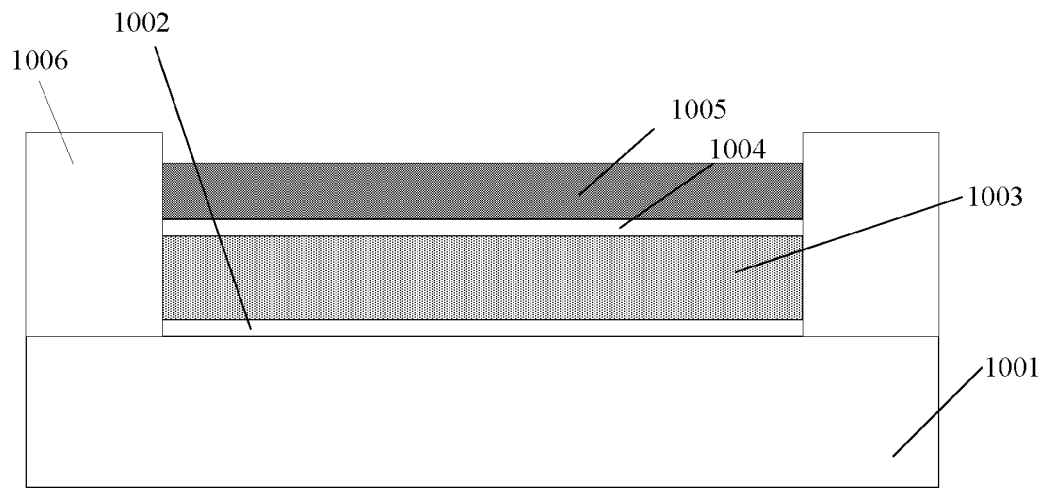

As illustrated in FIG. 3, shallow trench isolation (STI) may be formed on the silicon wafer by a conventional method, so as to isolate the devices from each other.

Figure 4:
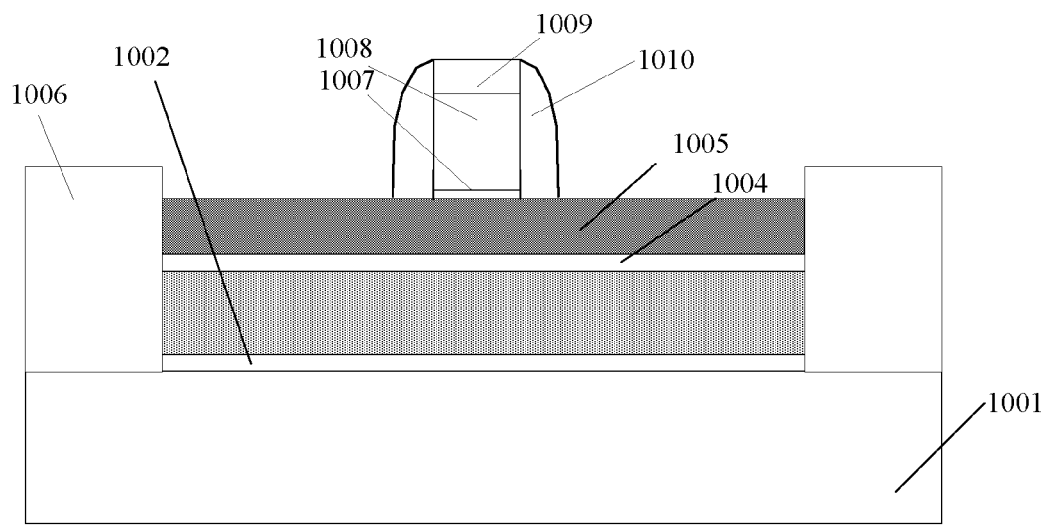

As illustrated in FIG. 4, a gate region is formed on the structure as illustrated in FIG. 3 by a conventional method. The detailed steps may be as follows: depositing a gate dielectric layer 1007 such as high-k gate dielectric layer on an SOI layer; depositing a metal layer 1008 on the gate dielectric layer; depositing a nitride layer such as Si$_3$N$_4$ on the metal layer; and selectively etching the nitride layer to form nitride sidewall spacers 1010 at both sides of the gate region, and form a nitride cap layer 1009 on the metal layer 1008. The embodiments of the present invention may adopt a gate-last technique in addition to the above gate-first technique. For example, after the source/drain regions are formed, or for the embodiments of the present invention, after a concentrated stress region is formed, the following steps may be carried out: removing the gate dielectric layer and the metal gate, re-depositing a new gate dielectric layer and a new metal layer, and forming the nitride cap layer 1009 on the gate metal layer 1008. The embodiments of the present invention are not limited thereby.

Figure 5:
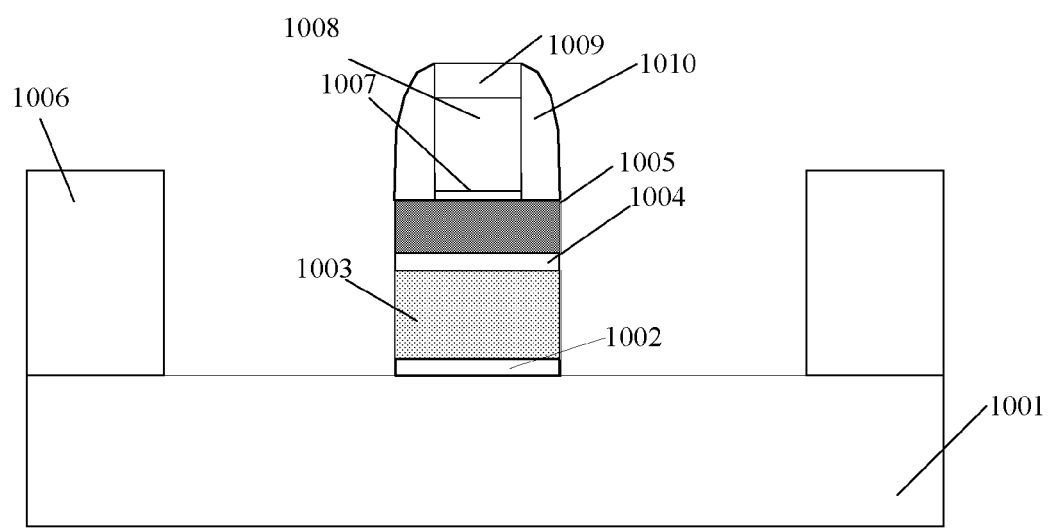

As illustrated in FIG. 5, after the gate region is formed, an SOI layer 1005, an oxide layer 1004, a BPSG layer 1003 and an oxide layer 1002 are etched, for example, by reactive ion etching (RIE), so as to substantially form the gate region and the concentrated stress region below the gate region.

Figure 6:
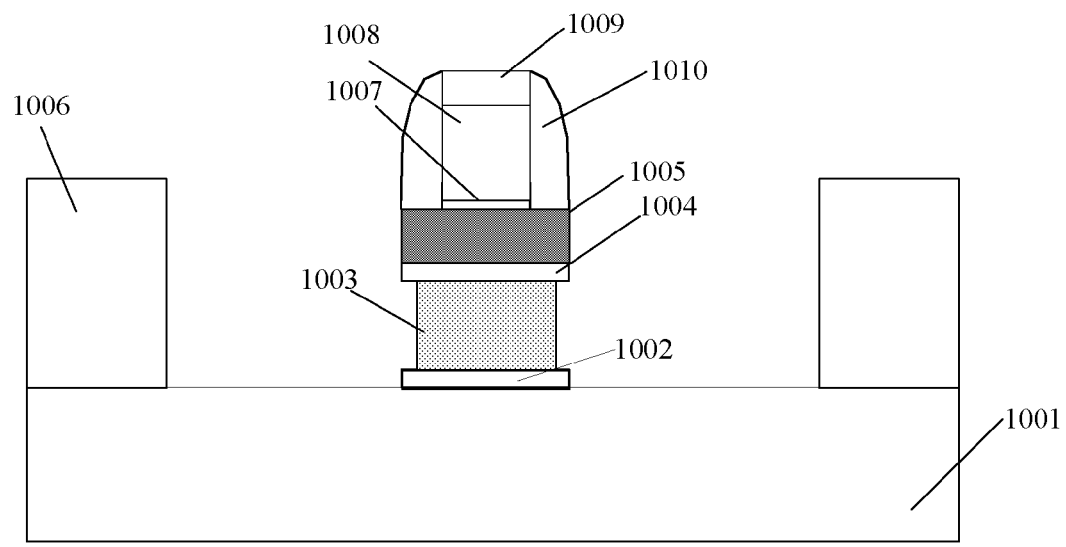

As illustrated in FIG. 6, preferably, the BPSG layer 1003 is further etched, so as to form an undercut therein. As can be seen from FIG. 6, the lateral width of the BPSG is smaller than that of the SOI layer 1005 located above. This step is optional.

Figure 7:
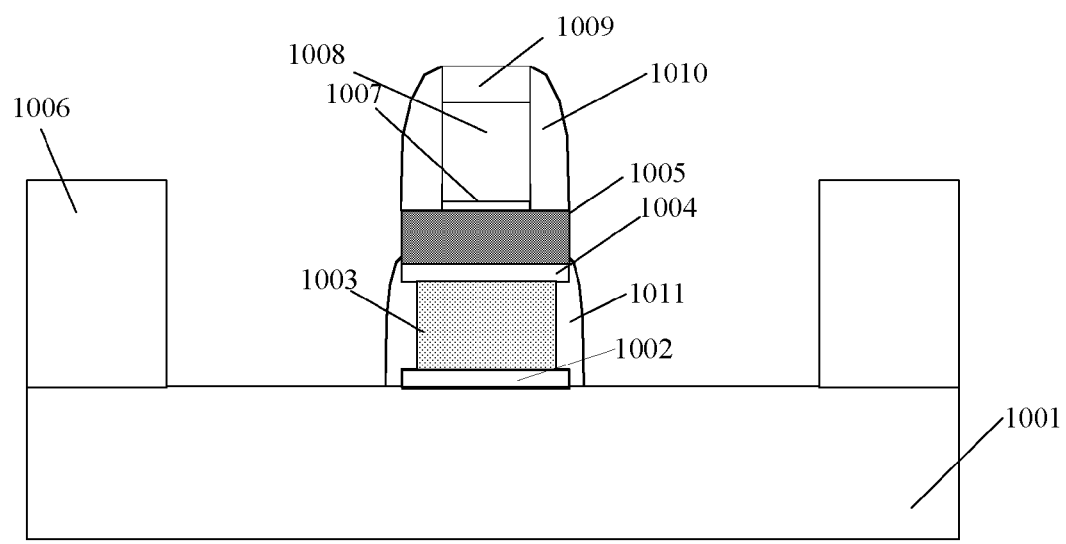

As illustrated in FIG. 7, sidewall spacers 1011 are formed at the periphery of the concentrated stress region. The detailed steps for forming the sidewall spacers may be as follows: depositing an amorphous SiGe layer on the device structure as illustrated in FIG. 6, preferably with a thickness of 5~15 nm and a Ge content of 5%~20%, forming the amorphous SiGe layer into a monocrystal or polycrystal SiGe layer by annealing, which at least covers a part of the substrate between adjacent STIs and the outer side of the SOI layer; and forming the sidewall spacers 1011 of the BPSG layer 1003 by etching the SiGe layer by RIE. The sidewall spacers may obstruct the BPSG from being diffused into the source/drain (S/D) regions to be formed later, and the formation of the undercut leads to thicker sidewall spacers and a better obstructing effect. It is also beneficial for the epitaxial growth of the S/D regions when the sidewall spacers are formed of SiGe. According to other embodiments of the present invention, the sidewall spacers may also be formed of Si, Si:C or other materials.

The concentrated stress region and the sidewall spacers of the BPSG have been formed heretofore.

Figure 8:
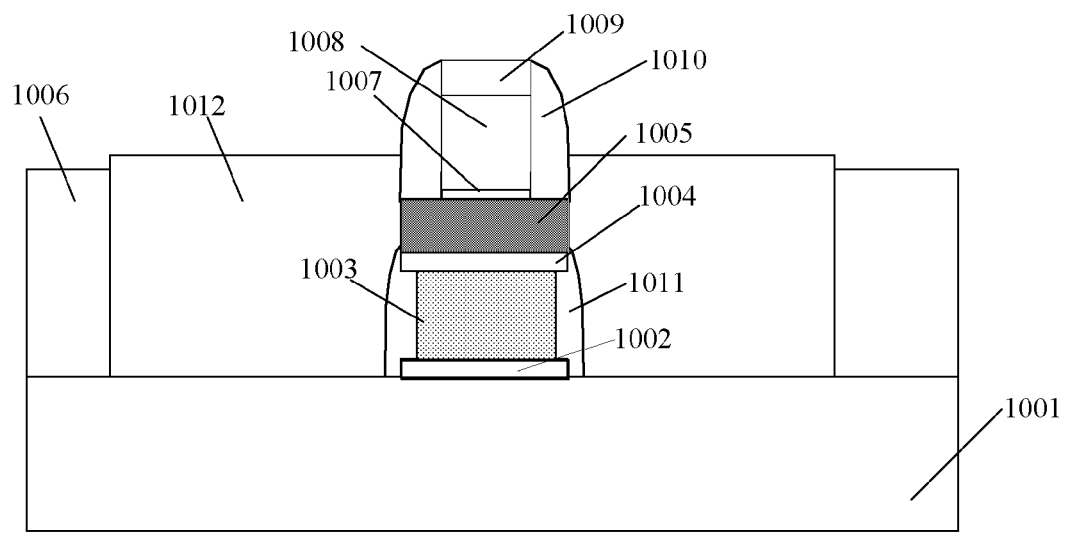

Next, as illustrated in FIG. 8, when an nMOSFET needs to be manufactured, a Si:C layer 1012 grows epitaxially from the sidewall spacers of the BPSG as the source. Preferably, the content of C is 0.2%~2%, and the amount may be determined according to the required performance of the device. This Si:C layer may be used as the S/D regions of the semiconductor device. For a pMOSFET, the S/D regions are formed by an epitaxial growth of SiGe from the sidewall spacers of the BPSG as the source. Preferably, the content of Ge in the SiGe layer is 15%~60%.

After that, the semiconductor device needs to be annealed, preferably at the annealing temperature of 900~1100° C., to soften the BPSG layer. In case of an nMOSFET, the stress in the glass layer is released due to the softening of the glass and the tensile stress of the S/D regions, and thus the tensile stress is concentrated at both sides of the SOI channel region to increase the electron mobility in the SOI channel. In case of a pMOSFET, the stress in the glass layer is released due to the softening of the glass and the compressive stress of the S/D regions, and thus the compressive stress is concentrated at both sides of the SOI channel region to increase the hole mobility in the SOI channel. Since the carrier mobility in the SOI channel is increased, the device performance is further improved.

Figure 9:
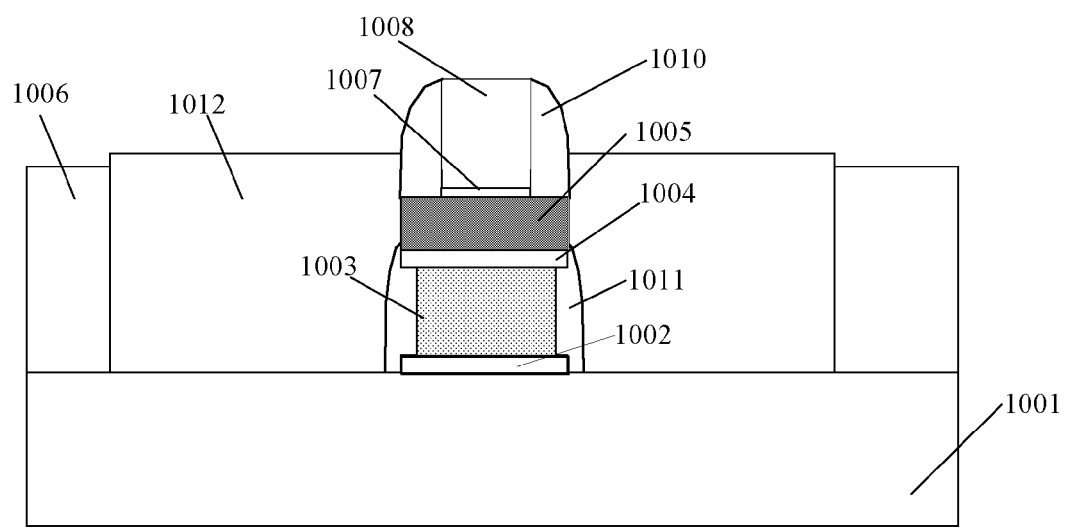

Finally, the nitride cap layer 1009 on the gate metal layer 1008 is etched to form the device structure as illustrated in FIG. 9. Subsequent processing of the device may be carried out according to a conventional process, e.g., the contact hole and a local interconnection structure may be formed by depositing interlayer dielectric (ILD).

Now a semiconductor device according to one embodiment of the present invention is obtained. As illustrated in FIG. 9, the semiconductor device according to one embodiment of the present invention includes: a gate region, a concentrated stress region and S/D regions located on a semiconductor substrate 1001. The gate region may include a gate dielectric layer 1007 and a gate metal layer 1008. However, the present invention is not limited thereby, and the gate region may include other structures. For example, NiSi may be formed on the metal layer to reduce the gate resistance. The source/drain region is formed by an epitaxial growth. In case of an nMOSFET, the source/drain region is formed of Si:C, wherein the content of C is preferably 0.2%~2%; while in case of a pMOSFET, the source/drain region is formed of SiGe, wherein the content of Ge is preferably 15%~60%. The concentrated stress region includes an SOI layer 1005 and a stress release layer 1003, wherein the stress release layer 1003 may be a material having a glass transition temperature lower than 1100° C., such as BPSG or PSG or the like. In addition, a diffusion barrier layer 1004 may be included between the SOI layer 1005 and the stress release layer 1003, preferably having a thickness of 10~20 nm. And a diffusion barrier layer 1002 may be included between the BPSG layer and the substrate 1001, preferably having a thickness of 50~100 nm. The stress release layer 1003 is softened by annealing at 900~1100° C., so that the SiGe in the S/D regions may apply a compressive stress to the gate region, or the Si:C in the S/D regions may apply a tensile stress to the gate region, thus stress is generated in the SOI channel to increase the carrier mobility and improve the device performance.

Preferably, sidewall spacers 1011 may be formed at the periphery of the stress release layer 1003, and the sidewall spacers 1011 are preferably made of monocrystal or polycrystal SiGe, wherein the content of Ge may be 5%-20%. The sidewall spacers may obstruct atoms such as B or P in the stress release layer from being diffused into the S/D regions. In order to further obstruct the diffusion, the stress release layer 1003 has a lateral width smaller than that of the SOI layer, so as to form undercuts at both sides of the stress release layer 1003 to therby make the thickness of the sidewall spacers 1011 become larger. The sidewall spacers 1011 are also beneficial for the epitaxial growth of the S/D regions.

According to the embodiments of the present invention, by the softening of the stress release layer and the stress of the S/D regions during the manufacturing process, a tensile or compressive stress may be applied to the device channel to increase the carrier mobility, so as to improve the device performance. In addition, the sidewall spacers at the periphery of the stress release layer and the upper and lower diffusion barrier layers in the embodiments of the present invention obstruct impurities in the glass from being diffused outwards, so as to ensure the device performance while enhancing the carrier mobility.

Although technical details such as patterning, etching or the like of each layer are not given in the above descriptions, a person skilled in the art will appreciate that, a layer or region of required shape may be formed by various means in the prior art. In addition, in order to form the same structure, a person skilled in the art may also design a method that is not completely the same as the method described above.

The present invention is described as above with reference to the embodiments. However, these embodiments are just explanatory, and do not intend to limit the scope of the present invention. The scope of the present invention is limited by the accompanied claims and their equivalents. A person skilled in the art can make various substitutions and modifications without deviating from the scope of the present invention, and those substitutions and modifications shall fall within the scope of the present invention.

What is claimed is:

1. A semiconductor device, comprising:
    a semiconductor substrate;
    a gate region located on the semiconductor substrate;
    S/D regions located at both sides of the gate region and made of a stress material; and a concentrated stress region formed between the gate region and the semiconductor substrate and sandwiched between the S/D regions, wherein the concentrated stress region comprises an upper SOI layer adjacent to the gate region, and a lower stress release layer adjacent to the semiconductor substrate.

2. The semiconductor device according to claim 1, wherein in case the semiconductor device is an nMOSFET, the stress material comprises a tensile stress material, and in case the semiconductor device is a pMOSFET, the stress material comprises a compressive stress material.

3. The semiconductor device according to claim 2, wherein, in case the semiconductor device is an nMOSFET, the stress material comprises Si:C, and in case the semiconductor device is a pMOSFET, the stress material comprises SiGe.

4. The semiconductor device according to claim 3, wherein in case the stress material comprises SiGe, the content of Ge in SiGe is 15%~60%, and in case the stress material comprises Si:C, the content of C in Si:C is 0.2%~2%.

5. The semiconductor device according to claim 1, wherein the lower stress release layer is softened by annealing at 700~1100° C.

6. The semiconductor device according to claim 1, wherein the lower stress release layer has a glass transition temperature lower than 1100° C.

7. The semiconductor device according to claim 1, wherein the lower stress release layer comprises BPSG and/or PSG.

8. A semiconductor device, comprising:
    a semiconductor substrate;
    a gate region located on the semiconductor substrate;

S/D regions located at both sides of the gate region and made of a stress material; and a concentrated stress region formed between the gate region and the semiconductor substrate and sandwiched between the S/D regions, wherein the concentrated stress region comprises an upper SOI layer adjacent to the gate region, and a lower stress release layer adjacent to the semiconductor substrate, further comprising a first diffusion barrier layer provided between the upper SOI layer and the lower stress release layer; and/or a second diffusion barrier layer provided between the lower stress release layer and the semiconductor substrate.

9. A semiconductor device, comprising:
a semiconductor substrate;
a gate region located on the semiconductor substrate;
S/D regions located at both sides of the gate region and made of a stress material; and a concentrated stress region formed between the gate region and the semiconductor substrate and sandwiched between the S/D regions, wherein the concentrated stress region comprises an upper SOI layer adjacent to the gate region, and a lower stress release layer adjacent to the semiconductor substrate, wherein the lower stress release layer has a lateral width smaller than that of the SOI layer, so as to form undercuts at both sides of the lower stress release layer.

10. A semiconductor device, comprising:
a semiconductor substrate;
a gate region located on the semiconductor substrate;
S/D regions located at both sides of the gate region and made of a stress material; and a concentrated stress region formed between the gate region and the semiconductor substrate and sandwiched between the S/D regions, wherein the concentrated stress region comprises an upper SOI layer adjacent to the gate region, and a lower stress release layer adjacent to the semiconductor substrate, further comprising sidewall spacers formed at both sides of the lower stress release layer.

11. The semiconductor device according to claim 10, wherein the sidewall spacers comprise any one of SiGe, Si:C and Si or any combination thereof.

12. The semiconductor device according to claim 11, wherein the content of Ge in SiGe forming the sidewall spacers is 5%~20%.

* * * * *